United States Patent
Novac

(10) Patent No.: US 7,598,821 B2
(45) Date of Patent: Oct. 6, 2009

(54) AMPLITUDE CONTROLLED QUARTZ OSCILLATOR WITH BROAD VOLTAGE AND TEMPERATURE RANGE

(75) Inventor: Pinchas Novac, Neuchatel (CH)

(73) Assignee: EM Microelectronic-Marin S.A., Marin (CH)

( * ) Notice: Subject to any disclaimer, the term of this patent is extended or adjusted under 35 U.S.C. 154(b) by 125 days.

(21) Appl. No.: 11/926,588

(22) Filed: Oct. 29, 2007

(65) Prior Publication Data

US 2008/0100390 A1 May 1, 2008

(30) Foreign Application Priority Data

Oct. 27, 2006 (EP) .................... 06123107

(51) Int. Cl.
*H03B 5/32* (2006.01)
(52) U.S. Cl. ............... 331/160; 331/109; 331/116 FE
(58) Field of Classification Search ............. 331/160, 331/158, 116 FE, 109, 183, 186
See application file for complete search history.

(56) References Cited

U.S. PATENT DOCUMENTS

| | | | | |
|---|---|---|---|---|
| 4,193,046 | A * | 3/1980 | Chiba ............... | 331/109 |
| 4,618,837 | A * | 10/1986 | Matsuura ............ | 331/160 |
| 2002/0180542 | A1 | 12/2002 | Aihara et al. | |
| 2005/0174183 | A1 | 8/2005 | Tachibana et al. | |

FOREIGN PATENT DOCUMENTS

| | | |
|---|---|---|
| CH | 580358 | 9/1976 |
| CH | 623450 | 6/1981 |
| JP | 11-186849 | 7/1999 |
| WO | 03/017284 | 2/2003 |

OTHER PUBLICATIONS

European Search Report issued in corresponding application No. EP 06 12 3107, completed Feb. 20, 2007.

* cited by examiner

*Primary Examiner*—Joseph Chang
(74) *Attorney, Agent, or Firm*—Griffin & Szipl, P.C.

(57) ABSTRACT

The invention concerns an oscillator including an input terminal, an output terminal, a resonator, and an oscillator circuit including: first and second power supply terminals, two capacitors connected between the first power supply terminal and the input terminal, and respectively the output terminal of the oscillator; first and second active transistors of complementary type, forming therewith an inverting amplifier, first and second means for respectively polarizing the first and the second active transistors, a first current source formed by a transistor of the same type as the second active transistor, between the second power supply terminal and the second active transistor, current control means for the second polarizing means, characterized in that in an steady operating conditions, said second polarizing means are arranged for providing a polarization voltage across the gate of the second active transistor corresponding to the transistor gate voltage of the first current source to within one voltage shift.

12 Claims, 6 Drawing Sheets

US 7,598,821 B2

AMPLITUDE CONTROLLED QUARTZ OSCILLATOR WITH BROAD VOLTAGE AND TEMPERATURE RANGE

This application claims priority from European Patent Application No. 06123107.2, filed Oct. 27, 2006, the entire disclosure of which is incorporated herein by reference.

FIELD OF THE INVENTION

The present invention concerns, generally, an oscillator circuit to be used for making a time base for an electronic watch, a portable telephone or any other electronic device requiring such a time base. The present invention concerns, more specifically, an amplitude controlled oscillator circuit.

BACKGROUND OF THE INVENTION

There is known from the prior art, in particular from CH Patent No. 580 358, an amplitude controlled quartz oscillator, shown in a simplified manner in FIG. 6. Such amplitude-controlled oscillators are used since they reduce the supply current as soon as the amplitude of the oscillator reaches a reasonable value. The oscillator core consists of an inverting amplifier with the quartz crystal as feedback and load capacitances C1 and C2 for providing the necessary phase difference. The transconductance necessary for the amplification stage, and thereby the current consumption of the oscillator, is for a given frequency proportional to the series resistance of the crystal, the oscillator amplitude and a capacitive factor that is a function of the load determined by C1 in series with C2. The oscillator core corresponding to the gain stage is formed by a single active transistor N1. The load is a current source $I_0$ which is controlled by the amplitude regulator. The feedback resistance Rf which is necessary for polarising the gate of active transistor N1 has to be very high, so as not to load the resonator circuit. The complementary transistor P1 acts as polarisation current source for active transistor N1, via the current mirror that it forms with transistor P2. This gain stage easily allows amplitude to be controlled and requires low supply voltage. However, in order to ensure optimum selected transconductance, the supply current has to be two times higher than for a solution consisting of two active transistors disclosed within CH Patent No. 623 450 as shown in FIG. 7.

In the example of the prior art shown in FIG. 7, the gain stage is formed by two active transistors, a transistor N1 in series with a complementary transistor P1. The transconductances are added in this case. Insofar as the same continuous current passes through both transistors, half of the current is necessary in order to obtain the same transconductance with a current source load. Nonetheless, this solution requires a considerably higher supply voltage and the use of a high capacitance C in parallel with transistor P2, which powers the two active transistors, which occupies a large surface area on the circuit, and increases the cost thereof while greatly degrading the power supply rejection rate.

SUMMARY OF THE INVENTION

It is one of the main objects of the present invention to overcome the aforementioned drawbacks by providing an oscillator with a high transconductance level without requiring the introduction of any elements that degrade the power supply rejection rate.

Thus, the present invention concerns an oscillator including an input terminal, an output terminal, a resonator, and an oscillator circuit including:

first and second power supply terminals,
two capacitors connected between the first power supply terminal and the input terminal, and respectively the output terminal of the oscillator,
a first active transistor connected between the first power supply terminal and the output terminal,
first means for polarising the first active transistor,
a second active transistor, of complementary type to the first active transistor and whose current path is series connected with the first active transistor,
second means for polarising the second active transistor,
a first current source formed by a transistor of the same type as the second active transistor, between the second power supply terminal and the second active transistor,
current control means for the second polarising means, characterized in that in an steady operating conditions, said second polarising means are arranged for providing a polarisation voltage at the gate of the second active transistor similar or corresponding to the transistor gate voltage of the first current source, to within one voltage shift.

This oscillator allows a high transconductance to be obtained due to the use of two complementary transistors polarised in active operating conditions, while not degrading the power supply rejection rate owing to the use of integrated polarising means for the second active transistor, which further ensures a more reduced necessary surface.

Insofar as this type of oscillator is arranged in numerous portable devices able to be powered in various ways and able to undergo all types of constraints, in particular temperature constraints, it is also important to ensure a broad voltage and temperature operating range for this type of oscillator. For this purpose, an independent and voltage stable current source is further provided, comprising means of protection from overvoltage due to a supply voltage that is too high.

As the overall object of the oscillator is to provide at output a clock signal at a given frequency, an amplifier for alternating signals is added for this purpose at the input of the circuit forming the core of the oscillator in order to be rid of distortion problems observed at the output. Advantageously, an inverting amplifier is provided at the oscillator input terminal including an inverter formed of two transistors of complementary type, controlled by means of two integrated capacitive input inverting amplifiers each powered by the output of the other capacitive input inverting amplifier and a power supply terminal, respectively the other power supply terminal to prevent a current peak demand when the output is switched.

In order to widen the operating temperature range of the oscillator, a temperature detector is advantageously provided, associated with a capacitive divider for adapting the transfer function of the amplitude regulator.

BRIEF DESCRIPTION OF THE DRAWINGS

Other features and advantages of the present invention will appear more clearly upon reading the following detailed description of embodiments of the invention given solely by way of non-limiting example and illustrated by the annexed drawings, in which.

DETAILED DESCRIPTION OF THE INVENTION

The present invention, which will now be explained, is given purely by way of non-limiting illustration with reference to FIGS. 1 to 5.

Figure 1:
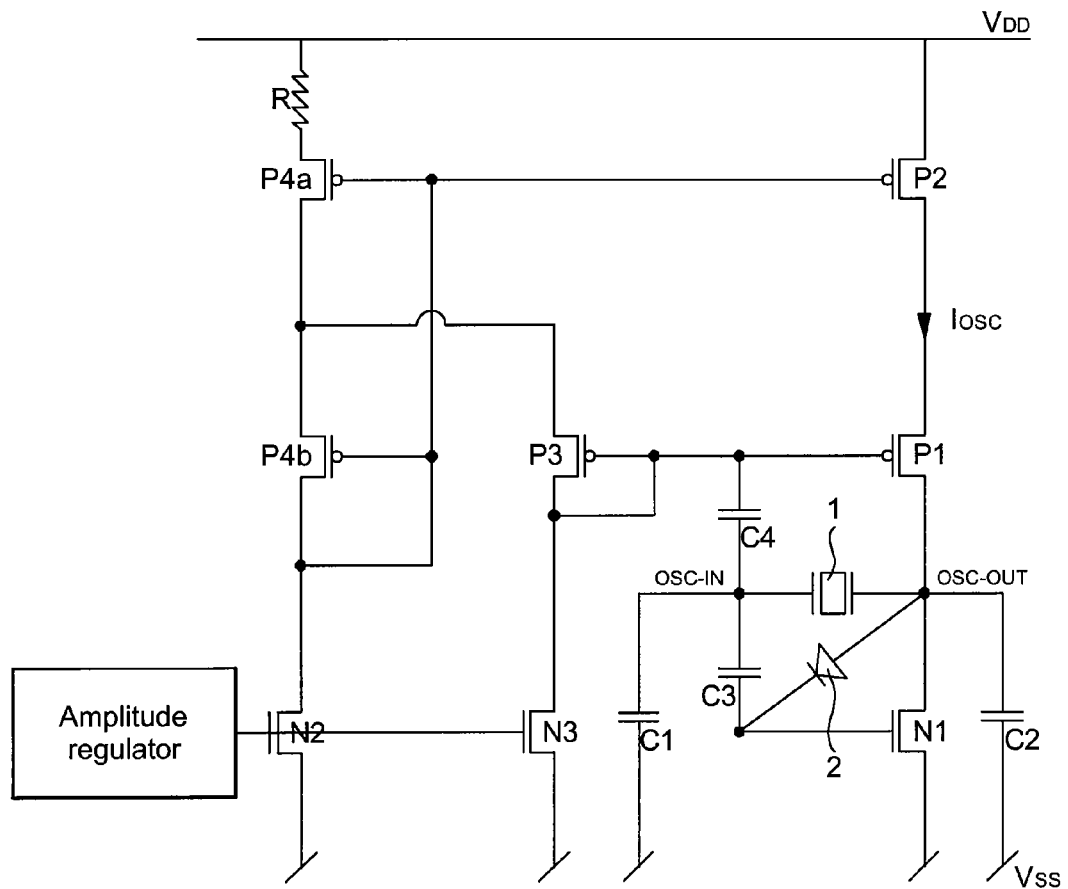
FIG. 1 is a diagram of the oscillator core according to a preferred embodiment of the invention.

FIG. 1 shows the oscillator core according to a preferred embodiment of the present invention. The oscillator includes an input terminal (osc_in), an output terminal (osc_out), a resonator 1, and an oscillator circuit, also called the oscillator core. The oscillator circuit is powered via two power supply terminals Vss and Vdd. Two capacitors C1 and C2 are connected between one of the power supply terminals Vss and the input terminal osc_in, respectively the output terminal osc_out, of the oscillator. These indispensable capacitors could be elements connected as indicated, or could be formed by stray capacitances, in particular that of active transistor N1 and connections, connected between power supply terminal Vss and the output terminal osc_out. Polarising means, advantageously formed by a diode connected between the gate of active transistor N1 and the output terminal osc_out could be provided for polarising active transistor N1. A second active transistor P1, of complementary type to active transistor N1, is arranged with a series connected current path to active transistor N1. A polarising current source, formed by transistor P2, of the same conduction type as active transistor P1, is connected between the power supply terminal Vdd and the source of active transistor P1. Capacitors C3 and C4 are connected between the input terminal osc_in and the gates. These oscillator input capacitors allow the oscillation signal to pass across the gates while having continuous independent polarisation, which reduces the oscillator current consumption without affecting its performance.

Ingeniously, the polarising means P3, P4a and P4b of active transistor P1 are arranged for providing, during the established or steady oscillator operating conditions, a polarisation voltage across the gate of active transistor P1 similar or corresponding to the gate voltage of transistor P2 plus or minus one voltage shift. According to an advantageous embodiment, these polarising means include three transistors of the same type as active transistor P1, a first transistor P3, providing the polarisation voltage across the gate of active transistor P1, polarisation voltage and second and third transistors P4a and P4b whose current paths are series connected and form a current mirror with transistor P2. These polarisation means are current controlled by resistor R and transistors N2 and N3 connected between power supply terminal Vss and the drain of transistor P4b respectively of transistor P3. Transistors N2 and N3 are themselves connected by their gate to a conventional amplitude regulator 4 the output control of which is a function of the oscillation signal amplitude of the oscillator. It will also be noted that during the start up period of the oscillator polarising means P3, P4a and P4b, transistor P2 and active transistor P1 form a current mirror, which guarantees the start current for the oscillator. The polarising means of active transistor P2 thus achieved, allow the use of high resistance for polarisation to be omitted while not degrading the power supply rejection rate.

It will be noted in the example given in conjunction with FIG. 1 that reference is made to a first active transistor of conductivity N and a second active transistor of complementary conductivity P. It is clear that the type of conductivity of these two transistors could be inverted, which involves inversion of the entire oscillator circuit, which would cause no difficulty to those skilled in the art and details of which will not be given here.

Figure 2:
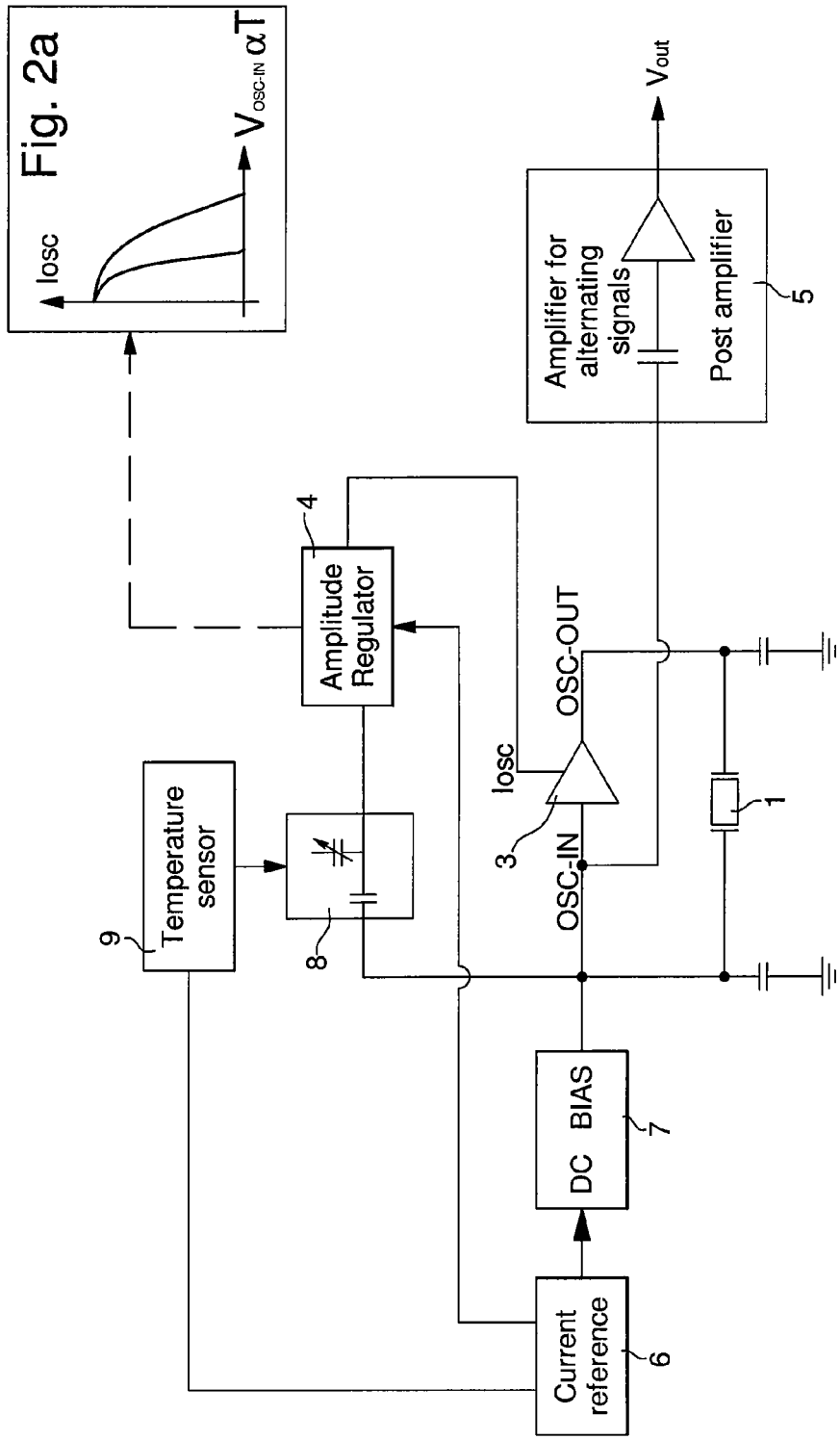
FIG. 2 is an overall diagram of the oscillator according to the invention.

FIG. 2 shows an overall diagram of the oscillator so as to extend the voltage and temperature operating range of the latter. It shows resonator 1 and the indispensable capacitors C1 and C1 of the oscillator, oscillator core 3, shown in detail in FIG. 1, amplitude regulator 4 for controlling the oscillator current lose as a function of the amplitude at the input of oscillator core 3. The diagram of this amplitude regulator is conventional, one example is provided in an article that appeared in the "IEEE Journal of Solid-States Circuits, vol. SC 12, No 3", dated June 1977 and entitled "CMOS Analog Integrated Circuits Based on Weak Inversion Operation" in FIG. 10 of that document. The diagram provided uses one type of conductivity, it is nonetheless evident that an equivalent diagram using the complementary type of conductivity could also be used depending upon the requirements of overall circuit.

The purpose of this overall oscillator circuit is to provide at output Vout a clock signal at a given frequency, for example 32 KHz. Thus, an amplifier for alternating signals 5 is added, placed at the input terminal osc_in of the oscillator core in order to be rid of distortion problems observed at output osc_out. Details of this amplifier for alternating signals 5 will be given in conjunction with FIG. 3.

It is one object of the present invention to be able to extend the voltage and temperature operating range of the oscillator. One recurring problem with the MOS technology transistors used to make this type of circuit arises from the maximum gate and drain voltages tolerated in saturated operation conditions, which are limited compared to the technology used, and are thus for example of the order of 3.6 Volts. However, in numerous applications, it is useful to be able to use this oscillator circuit with a power supply delivering a much higher supply voltage, for example of the order of 5.5 Volts. In order to be able to extend the voltage operating range, for example from 3.6 Volts to 5.5 Volts, a reference temperature stable current 6 is used, coupled to a polarisation distribution current, the detail of which will be given in connection with FIG. 4. This current reference is preferably coupled to a polarising circuit for a continuous voltage 7, which fixes the continuous component level at the oscillator input osc_in.

It has become clear that the operating limit of the oscillator in the temperature range is limited in particular because of amplitude regulator 4. This is why, in order to extend the temperature operating range, the transfer function of amplitude regulator 4 is adapted by means of a capacitive divider 8, placed at the input of the amplitude regulator and whose capacitance value depends upon the temperature detected by means of a temperature sensor 9. An example of capacitive divider 8 adapting the transfer function (see the box in FIG. 2a) of amplitude regulator 4 as a function of the temperature detected is shown in conjunction with FIGS. 5a to 5c.

Figure 3:
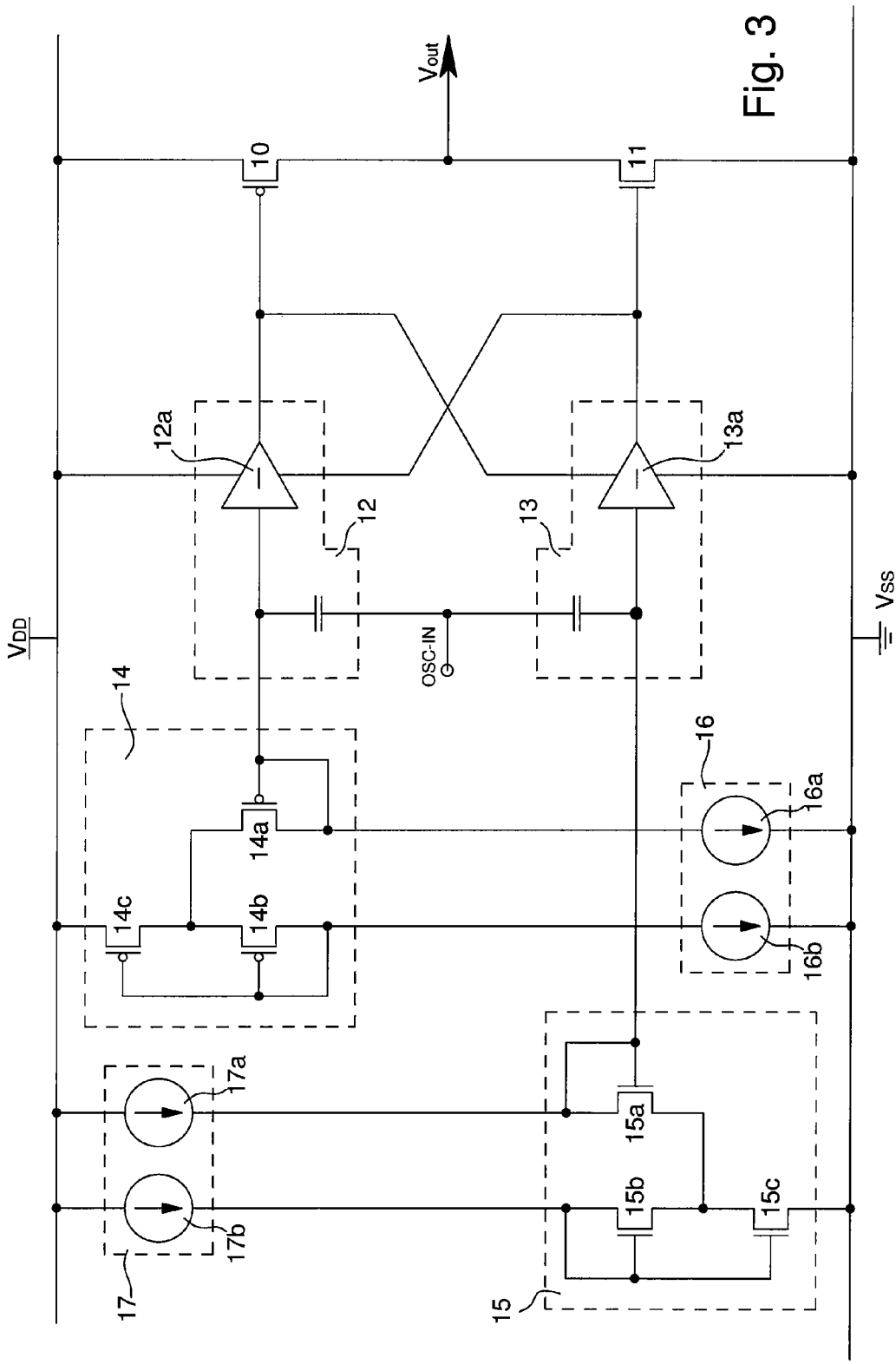
FIG. 3 is a diagram of the inverting amplifier stage at the oscillator output.

FIG. 3 shows the amplification stage for alternating signals connected to the oscillator input terminal osc_in and supplying the output signal Vout used by the portable electronic device in which the oscillator is integrated. It will be noted that this stage is placed at the input terminal osc_in so as not to avoid the distortion appearing at the output terminal osc_out.

This alternating signal amplification stage includes an inverting amplifier formed of two complementary transistors 10 and 11, for shaping the output signal and controlled by means of two integrated capacitive input inverting amplifiers 12 and 13, each powered by the output of the other capacitive input inverting amplifier and a power supply terminal, and respectively the other power supply terminal. It will be noted that the power supply of transistors 12 and 13 is advantageously connected so as to prevent simultaneous conduction of transistors 10 and 11 during the transition of the output signal. The advantage of this control with no overlap of transistors 10 and 11 is to prevent a significant increase in power consumption for broad supply voltages. Indeed, the use of a conventional CMOS inverter where control of the gate of the two transistors is common, would cause the presence of a transition current as soon as the supply voltage exceeds the sum of the threshold voltages of the two transistors and would thus greatly increase with the increase in supply voltage (for example between 3 and 5.5 V), which is evidently undesirable. A solution consisting in powering this inverter with a voltage reducer regulator is also undesirable because of the complication that this would involve in reducing the supply voltage.

Advantageously, the inputs of inverting amplifiers 12a, 13a are also polarised by polarisation means 14, respectively 15, thereby not only omitting the use of a large resistor but also directly using the supply voltage available in the rest of the oscillator circuit without any need to provide a supply voltage reducer regulator circuit. These polarisation means include three transistors of the same type as transistor 10, respectively 11, of the output inverting amplifier, a first transistor 14a, respectively 15a providing the polarising voltage for inverting amplifier 12a, respectively 13a, and second and third transistors 14b and 14c, respectively 15b and 15c whose current paths are series connected, the drain of transistor 14a, respectively 15a being connected between transistors 14b and 14c, respectively 15b and 15c. Transistors 14a and 14b are connected to the power supply terminal Vss via a current source 16a, respectively 16b. Likewise, transistors 15a and 15b are connected to the power supply terminal Vdd via a current source 17a, respectively 17b.

Figure 4:
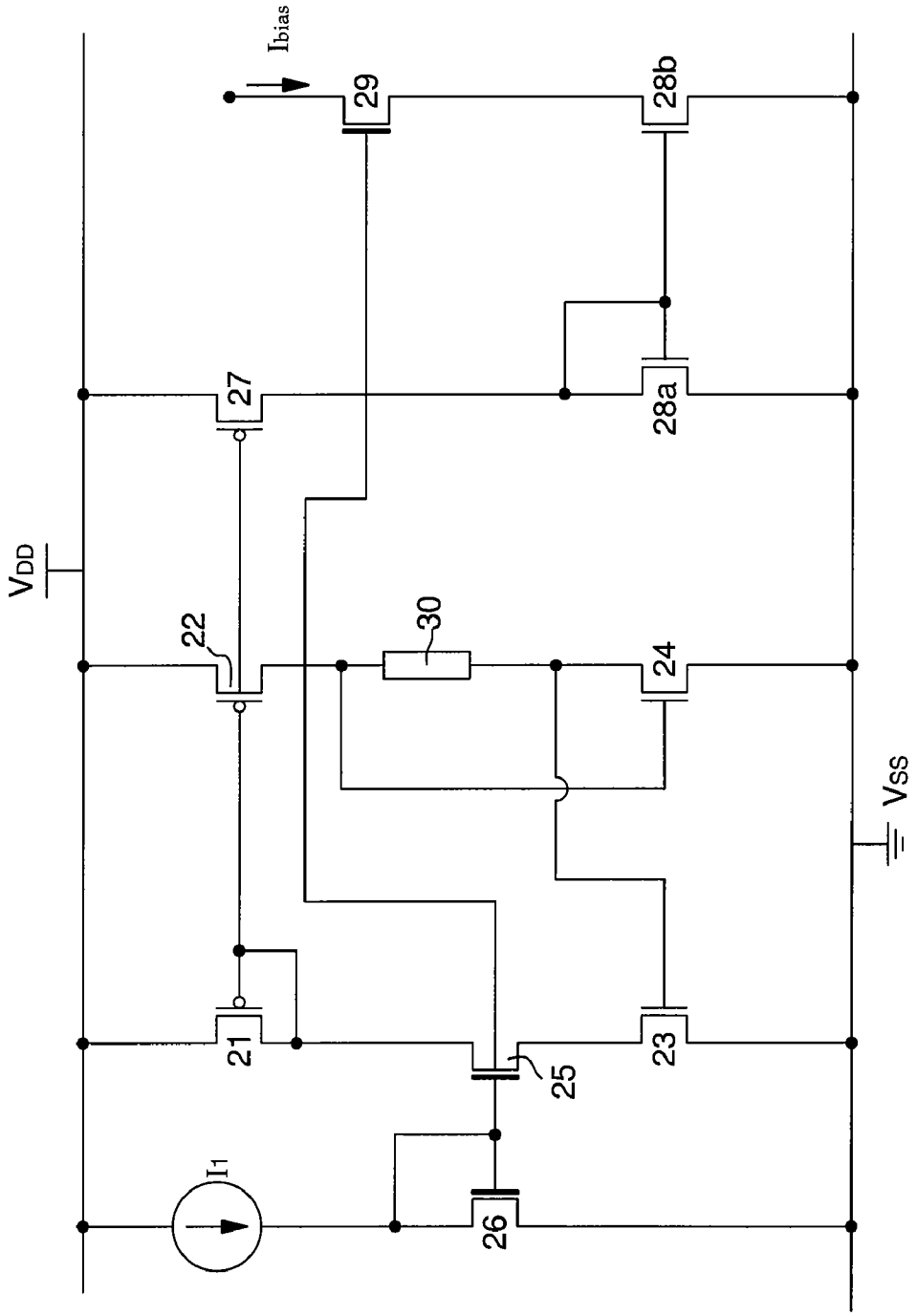
FIG. 4 is a diagram of the voltage and temperature stable current source.

FIG. 4 shows an advantageous embodiment of a voltage and temperature stable current source for, in particular, extending the voltage operating range of the oscillator. The current source includes two transistors 21 and 22, for example of conductivity P, forming a first current mirror with a gain determined by the features of the transistors. It further includes two transistors 23 and 24, of complementary conductivity N, operating in slight inverting operation conditions, to which a resistor 30 is added arranged between the two gates of the two transistors 23 and 24.

In order to prevent the current, drain and source terminals of transistor 23 being subjected to too great a potential difference, in the case of a supply voltage of the order of 5 Volts between terminals Vdd and Vss, a high voltage transistor 25 is inserted in the branch formed by transistors 21 and 23, mounted in source follower mode to separate the drain of transistor 23 from supply voltage Vdd less the threshold voltage of transistor 21. High voltage transistor 25 is controlled via a current source $I_1$ and another high voltage transistor 26 mounted in current mirror with high voltage transistor 25. In this manner, the drain voltage of transistor 23 will be equal to the gate voltage of high voltage transistor 25 approximately equal to a threshold voltage less its own threshold voltage.

In order to prevent the current drain and source terminals of transistor 22 being subjected to too great a potential difference, although this is less critical than for transistor 23, because of the potential drop through resistor 30, protection is nonetheless provided by using an elongated channel transistor for transistor 23.

Thus, this current source has the advantage of providing a solution with a broad voltage range.

As the polarisation current distribution has this current source as reference, the rest of the oscillator circuit is made by a current mirror structure, via a transistor 27 forming a current mirror with the transistor 22 associated with a current mirror formed by transistors 28a and 28b. As for transistor 23, in order to protect the whole of the circuit from potential differences that are too great, due to the use of a higher power supply, transistor(s) 28b are protected by high voltage transistor(s) 29 connected in source follower mode and with the gate thereof connected to the same potential as that of high voltage transistor 26. This also improves control of the polarisation current by ensure the same drain voltage for the current mirror transistors.

Figure 5A:
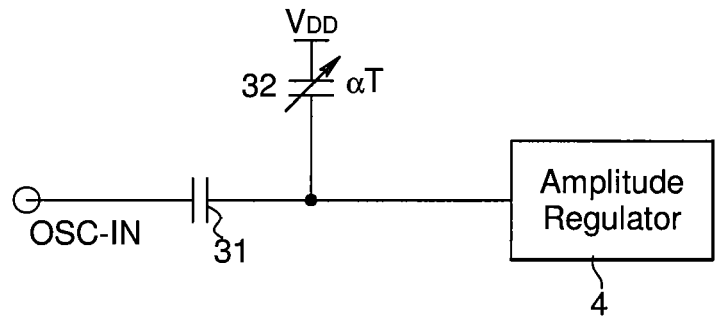
FIG. 5a shows a first example embodiment of the capacitive divider circuit placed at the input of the amplitude regulator.

FIG. 5a shows a first example diagram of a capacitive divider arranged between the temperature sensor and amplitude regulator 4. This capacitive divider introduces an attenuation factor for adapting the amplitude regulator transfer function. According to this example, the capacitive divider includes a first capacitor 31 of determined capacitance value and a second capacitor 32 with variable capacitance whose capacitance value depends on the temperature detected. Thus the capacitance value of variable capacitor 32 is increased when the temperature drops, so as to reduce the attenuation factor resulting from the capacitance ratio C31/C32 and conversely the capacitance value of capacitor 32 is decreased when the temperature increases, so as to increase the attenuation factor. As a result, the transfer function of amplitude regulator 4 is adapted such that the operating point with the oscillator corresponds to a current lose higher than the critical current lcrit below which the amplitude decreases sharply.

Figure 5B:
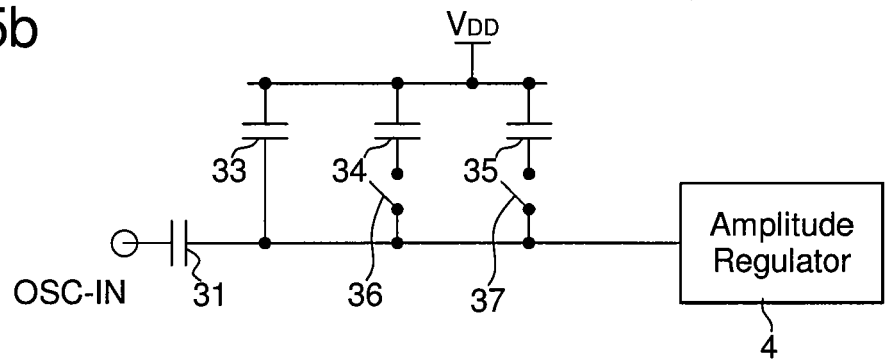
FIG. 5b shows a second example embodiment of the capacitive divider circuit placed at the input of the amplitude regulator.

FIG. 5b shows a second example diagram of a capacitive divider made from discrete components. Capacitor 31 is shown again with a given capacitance value. The variable capacitance capacitor 32 is replaced in this example by three capacitors 33, 34 and 35 connected in parallel to each other such that their capacitances are added together. Switches 36 and 37 are provided on the branches containing capacitors 34, respectively 35, so that at least three attenuation factors, corresponding to three temperature ranges, can be fixed, depending upon whether the switches are open or closed.

Thus, for example, a first attenuation factor FA=C31/(C33+C34) obtained when switch 36 is closed and switch 37 is open, is used is for a temperature range from 0° C. to 70° C. A second attenuation factor FA_BT=C31/(C33+C34+C35) obtained when both switches 36 and 37 are closed, is used for low temperature less than 0° C. A third attenuation factor FA_HT=C31/C33 obtained when both switches 36 and 37 are open, is used for high temperatures above 70° C.

Figure 5C:
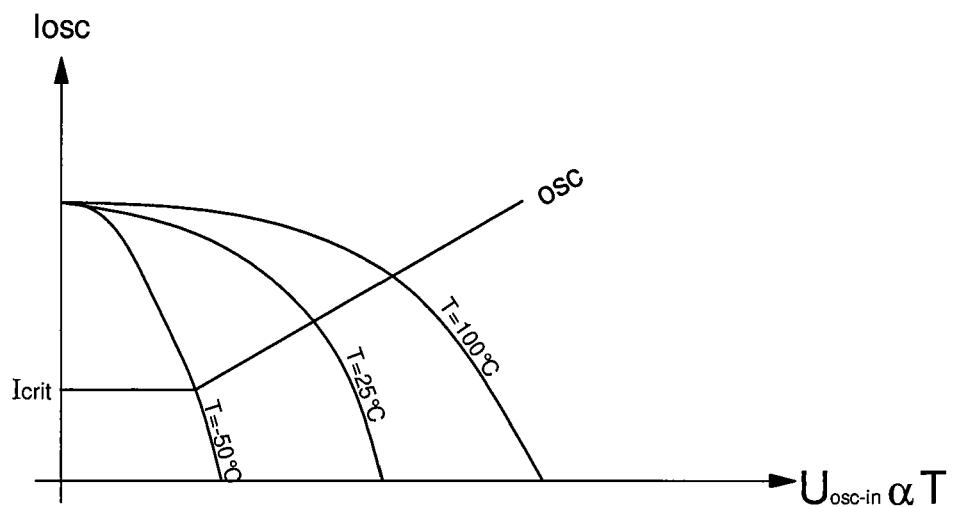
FIG. 5c shows the evolution of the oscillator current curve as a function of the temperature dependent oscillator voltage.
Figure 6:
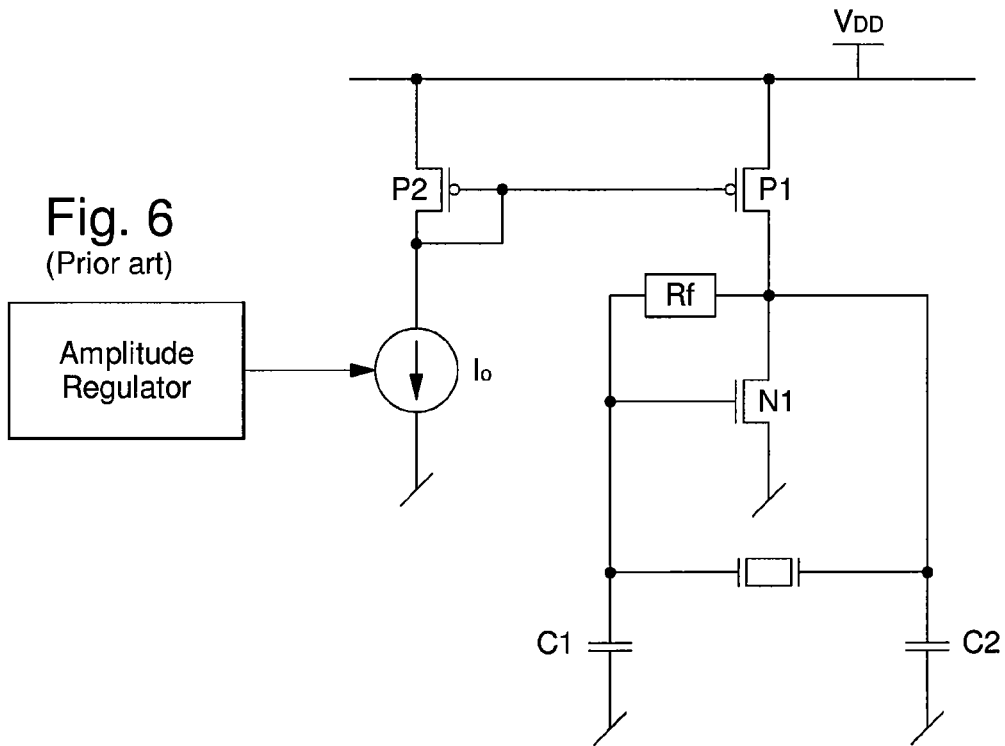
FIGS. 6 and 7, already described, show diagrams of oscillator cores according to the invention.
Figure 7:
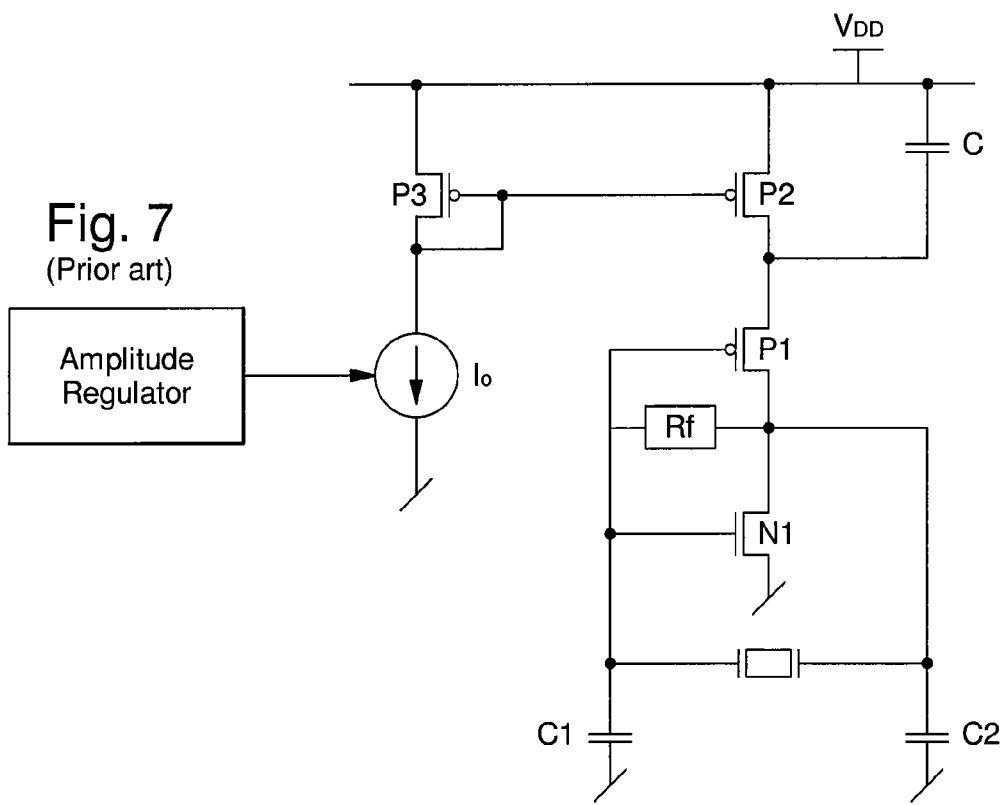

FIG. 5c shows the evolution of the oscillator current curve lose as a function of the oscillator input voltage Uosc_in as a function of the attenuation factor applied (FA, FA_BT, FA_HT) depending upon the temperature values detected.

It will be understood that various alterations and/or improvements and/or combinations evident to those skilled in the art can be made to the different embodiments of the invention explained above without departing from the scope of the invention defined by the annexed claims.

What is claimed is:

1. An oscillator including an input terminal, an output terminal, a resonator, and an oscillator circuit including:
first and second power supply terminals,
two capacitors connected between the first power supply terminal and the input terminal, and respectively the output terminal of the oscillator,
a first active transistor connected between the first power supply terminal and the output terminal,
first means for polarising the first active transistor,
a second active transistor, of complementary type to the first active transistor and whose current path is series connected with the first active transistor and forming therewith an inverting amplifier,
second means for polarising the second active transistor,
a first current source formed by a transistor of the same type as the second active transistor, between the second power supply terminal and the second active transistor,
current control means for the second polarising means,
wherein in steady operating conditions, said second polarising means are arranged for providing a polarisation voltage across the gate of the second active transistor corresponding to the transistor gate voltage of the first current source to within one voltage shift.

2. The oscillator according to claim 1, wherein said second polarising means include three transistors of the same type as the second active transistor, a first transistor providing at the gate of the second active transistor, the polarisation voltage and second and third transistors whose current paths are series connected and form a current mirror with the transistor forming the first current source.

3. The oscillator according to claim 1, wherein in the start up period said second polarising means, said first current source and said second active transistor form a current mirror.

4. The oscillator according to claim 1, wherein said current control means are formed by two control transistors whose gate is connected to an amplitude regulator and a resistor arranged between the second supply terminal and the second transistor of said second polarising means.

5. The oscillator according to claim 1, wherein an inverting amplifier circuit is provided at the oscillator input terminal including an inverter formed of two transistors of complementary types, controlled by means of two integrated inverting amplifiers with capacitive inputs each powered by the output of the other capacitive input inverting amplifier and a power supply terminal, respectively the other power supply terminal to prevent a current peak demand during the output switch.

6. The oscillator according to claim 5, wherein the inverting amplifier circuit includes third and fourth polarising means for polarising said capacitive input inverting amplifiers, said third and fourth polarising means are arranged so as to use directly the supply voltage available in the rest of the oscillator circuit.

7. The oscillator according to claim 1, wherein said oscillator includes an independent and voltage stable current source including means of protection against possible overvoltage due to a high supply voltage.

8. The oscillator according to claim 7, wherein said current source includes first and second transistors, of a first type of conductivity, forming a current mirror with a determined gain, third and fourth transistors of the complementary type of conductivity, operating in low inversion mode and a resistor arranged between the gates of said third and fourth transistors.

9. The oscillator according to claim 8, wherein the protection means against overvoltage include a high voltage transistor mounted in follower mode for protecting the drain of the third transistor from the high voltage.

10. The oscillator according to claim 9, wherein the protection means against overvoltage are further formed by the second transistor which has an elongated channel.

11. The oscillator according to claim 1, wherein said oscillator further includes a temperature sensor associated with a capacitive divider for adapting the transfer function of an amplitude regulator in order to extend the temperature operating range.

12. The oscillator according to claim 11, wherein the capacitive divider has at least three adaptation levels.

* * * * *